US012720666B2

(12) United States Patent
Cho et al.

(10) Patent No.: US 12,720,666 B2
(45) Date of Patent: Aug. 25, 2026

(54) ELECTRONIC DEVICE INCLUDING A SUBSTRATE WITH AN ELECTRONIC COMPONENT AND A HEAT EMITTING BODY DISPOSED ON RESPECTIVE SURFACES OF THE SUBSTRATE

(71) Applicant: LG INNOTEK CO., LTD., Seoul (KR)

(72) Inventors: Yong Seok Cho, Seoul (KR); Won Seok Nam, Seoul (KR); Jae Sam Lee, Seoul (KR); Yun Young Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 344 days.

(21) Appl. No.: 18/578,568

(22) PCT Filed: Jul. 7, 2022

(86) PCT No.: PCT/KR2022/009891
§ 371 (c)(1),
(2) Date: Jan. 11, 2024

(87) PCT Pub. No.: WO2023/287114
PCT Pub. Date: Jan. 19, 2023

(65) Prior Publication Data

US 2026/0122763 A1 Apr. 30, 2026

(30) Foreign Application Priority Data

Jul. 14, 2021 (KR) ........................ 10-2021-0092355

(51) Int. Cl.
*H05K 1/02* (2006.01)
*H05K 1/184* (2026.01)
(Continued)

(52) U.S. Cl.
CPC ........... *H05K 1/0204* (2013.01); *H05K 1/184* (2013.01); *H05K 7/205* (2013.01);
(Continued)

(58) Field of Classification Search
CPC ... H05K 2201/066; H05K 2201/10416; H05K 1/0204; H05K 1/184; H05K 7/205; H05K 7/20509; H10W 40/242
See application file for complete search history.

(56) References Cited

U.S. PATENT DOCUMENTS 4,731,693 A * 3/1988 Berg .................... H05K 7/1061 257/713
5,920,458 A * 7/1999 Azar .................... H05K 1/0204 257/713
(Continued)

FOREIGN PATENT DOCUMENTS

EP 1 445 799 A2 8/2004
JP 6-252303 A 9/1994
(Continued)

OTHER PUBLICATIONS

International Search Report dated Oct. 21, 2022 in International Application No. PCT/KR2022/009891.
(Continued)

*Primary Examiner* — Zachary Pape
(74) *Attorney, Agent, or Firm* — SALIWANCHIK, LLOYD & EISENSCHENK

(57) ABSTRACT

This electronic device comprises: a substrate including a hole; an electronic component disposed on one surface of the substrate; a heat emitting body disposed on the other surface of the substrate; and a heat transfer member disposed between the electronic component and the heat emitting body, wherein the hole includes a first region into which a portion of the heat transfer member is inserted and a second region having a smaller width than the first region.

16 Claims, 5 Drawing Sheets

(51) Int. Cl.
*H05K 7/20* (2006.01)
*H10W 40/20* (2026.01)

(52) U.S. Cl.
CPC .................. *H05K 2201/066* (2013.01); *H05K 2201/10416* (2013.01); *H05K 2201/10757* (2013.01); *H10W 40/242* (2026.01)

(56) References Cited

U.S. PATENT DOCUMENTS

| | | | | |
|---|---|---|---|---|
| 5,960,535 | A | 10/1999 | Rubens et al. | |
| 6,657,866 | B2 * | 12/2003 | Morelock | H05K 1/0204 257/720 |
| 10,842,015 | B2 * | 11/2020 | Kita | H05K 1/181 |
| 11,497,142 | B2 * | 11/2022 | Hellström | H05K 7/2039 |
| 2008/0198557 | A1 * | 8/2008 | Lim | H05K 7/205 361/719 |
| 2018/0326924 | A1 * | 11/2018 | Haraguchi | H02G 3/16 |
| 2021/0105891 | A1 | 4/2021 | Uchida et al. | |

FOREIGN PATENT DOCUMENTS

| | | | |
|---|---|---|---|
| JP | 11-330750 | A | 11/1999 |
| JP | 2010-141279 | A | 6/2010 |
| JP | 2013-123011 | A | 6/2013 |
| KR | 10-2018-0060572 | A | 6/2018 |

OTHER PUBLICATIONS

Supplementary European Search Report dated May 30, 2025 in European Application No. 22842376.

* cited by examiner

ELECTRONIC DEVICE INCLUDING A SUBSTRATE WITH AN ELECTRONIC COMPONENT AND A HEAT EMITTING BODY DISPOSED ON RESPECTIVE SURFACES OF THE SUBSTRATE

CROSS-REFERENCE TO RELATED APPLICATIONS

This application is the U.S. national stage application of International Patent Application No. PCT/KR2022/009891, filed Jul. 7, 2022, which claims the benefit under 35 U.S.C. § 119 of Korean Application No. 10-2021-0092355, filed Jul. 14, 2021, the disclosures of each of which are incorporated herein by reference in their entirety.

TECHNICAL FIELD

The present embodiment relates to an electronic device.

BACKGROUND ART

Engine electrical devices (starting devices, ignition devices, and charging devices) and lighting devices are common as automobile electrical devices, but recently, most systems, including chassis electrical devices, are becoming electrically electronic as vehicles become more electronically controlled.

Various electrical components such as lamps, audio systems, heaters, and air conditioners installed in automobiles are designed to receive power from the battery when the car is stopped and from the generator when driving, and at this time, the generation capacity of the 14V power system is used as a normal power supply voltage.

Recently, along with the development of the information technology industry, various new technologies (motor-type power steering, Internet, and the like) aimed to enhance the convenience of automobiles are being adopted by vehicles, and in the future, it is expected that the development of new technologies that can maximally utilize the current automotive systems will continue.

The external shape of an electronic device is formed by housing. Inside the housing, a number of electronic components for driving are disposed. The electronic components generate heat when driven. Heat can cause overload of electronic components, disrupting setup functions and causing malfunctions. Accordingly, a structure or means for dissipating heat from components inside an electronic device is required.

DETAILED DESCRIPTION OF THE INVENTION

Technical Subject

The present embodiment is intended to provide an electronic device that can enhance heat dissipation efficiency by improving its structure.

Technical Solution

An electronic device according to the present embodiment comprises: a substrate including a hole; an electronic component being disposed on one surface of the substrate; a heat emitting body being disposed on the other surface of the substrate; and a heat transfer member being disposed between the electronic component and the heat emitting body, wherein the hole includes a first region into which a portion of the heat transfer member is inserted and a second region having a smaller width than the first region.

When the arrangement direction of the first region and the second region is referred to as a first direction, the length of the portion of the heat transfer member can be longer than the length of the second region with respect to a second direction perpendicular to the first direction.

The substrate may include a circuit pattern being electrically connected to the electronic component.

When the length of the second region in a first direction is L1 and the separation distance between the second region and the circuit pattern with respect to the first direction is L2, L1:L2=2:1 can be satisfied.

A step being protruded more inward than other regions may be disposed on an inner surface of the hole.

It may include an insulating pad being disposed between the heat emitting body and the heat transfer member.

The heat emitting body may include a plurality of heat dissipation fins being protruded from the outer surface.

The surface of the heat emitting body facing the substrate may be an inner surface of the housing that forms the external shape of the electronic device.

An electronic device according to another embodiment comprises: a substrate including a hole; an electronic component being disposed on one side of the substrate; a heat emitting body being disposed on the other surface of the substrate; and a heat transfer member being disposed between the electronic component and the heat emitting body, wherein the heat transfer member penetrates the substrate, and wherein one side surface of the heat transfer member is spaced apart from one side surface of the hole of the substrate in a first direction.

An electronic device according to another embodiment comprises: a substrate including a hole; an electronic component being disposed on one surface of the substrate; a heat emitting body being disposed on the other surface of the substrate; and a heat transfer member being disposed between the electronic component and the heat emitting body, wherein the heat transfer member includes: a body portion having a length greater than the length of the hole with respect to a first direction; and a protruded portion being extended from the body portion to be disposed in the hole of the substrate and connected to the electronic component.

Advantageous Effects

Through the present embodiment, due to the contact structure between the electronic component and the heat transfer member, the driving heat of the electronic component is easily transferred to the heat transfer member and the heat emitting body, which has the advantage of enhancing heat dissipation efficiency.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention. In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used.

These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or disposed in "on (above)" or "below (under)" of each component, "on (above)" or "below (under)" means that it includes not only the case where the two components are directly in contact with, but also the case where one or more other components are formed or disposed between the two components. In addition, when expressed as "on (above)" or "below (under) ", the meaning of not only an upward direction but also a downward direction based on one component may be included.

An electronic device according to the present embodiment is provided inside a vehicle and may include a converter, an electronic control unit, a pump, and a motor controller. However, this is an example, and the electronic device according to the present specification may include various devices in which at least one electronic component is disposed inside a housing.

Figure 1:
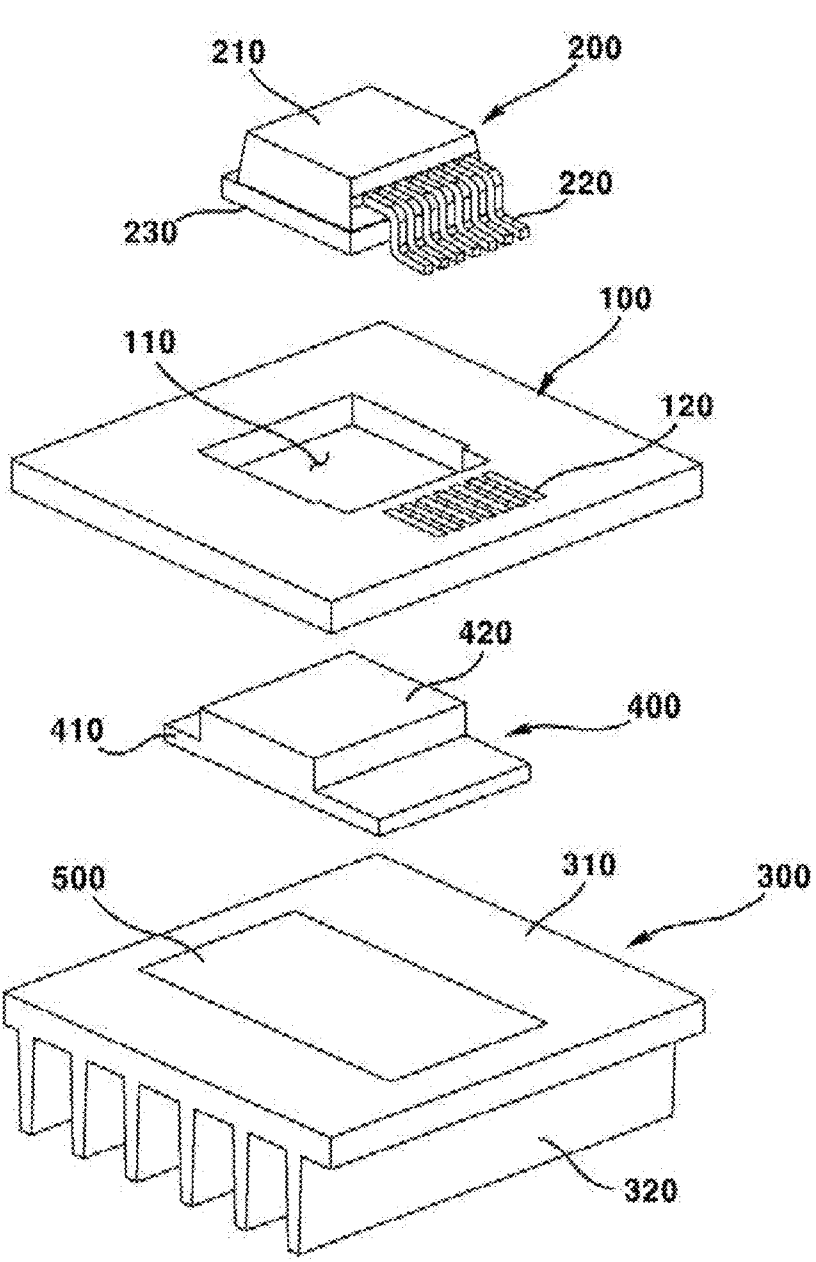
FIG. 1 is an exploded perspective view of a printed circuit board module according to an embodiment of the present invention.
Figure 2:
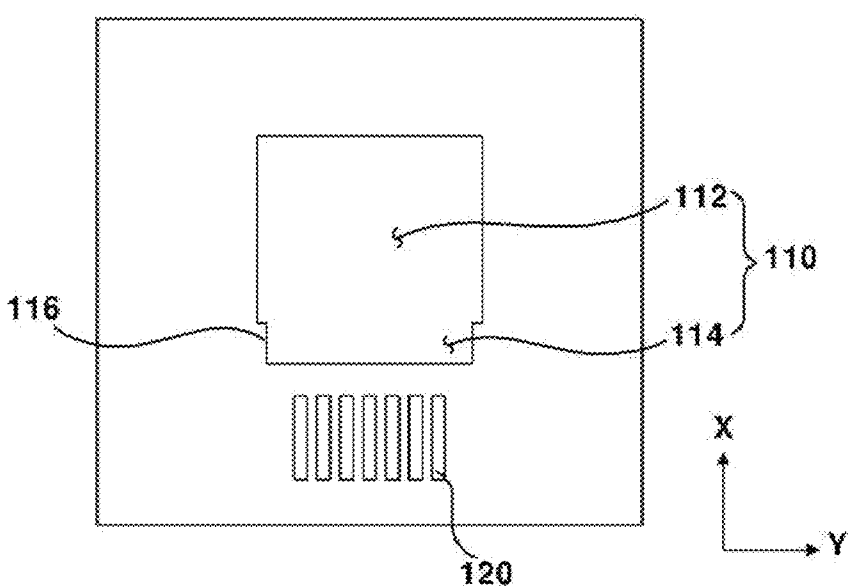
FIG. 2 is a plan view illustrating one surface of a printed circuit board according to an embodiment of the present invention.
Figure 3:
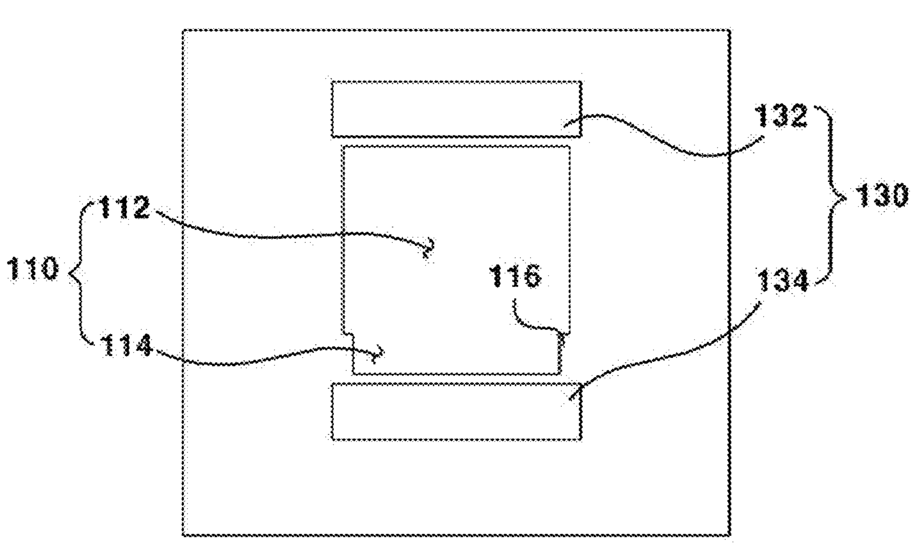
FIG. 3 is a plan view illustrating the other surface of a printed circuit board according to an embodiment of the present invention.
Figure 4:
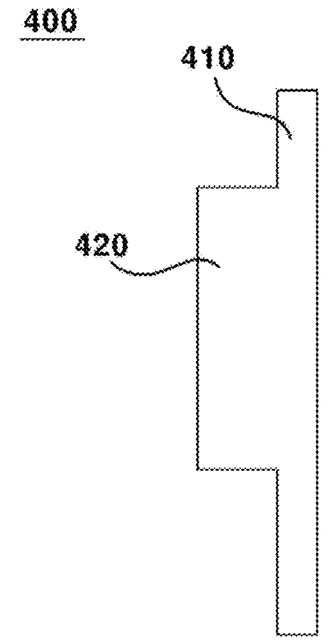
FIG. 4 is a plan view illustrating a side surface of a heat transfer member according to an embodiment of the present invention.
Figure 5:
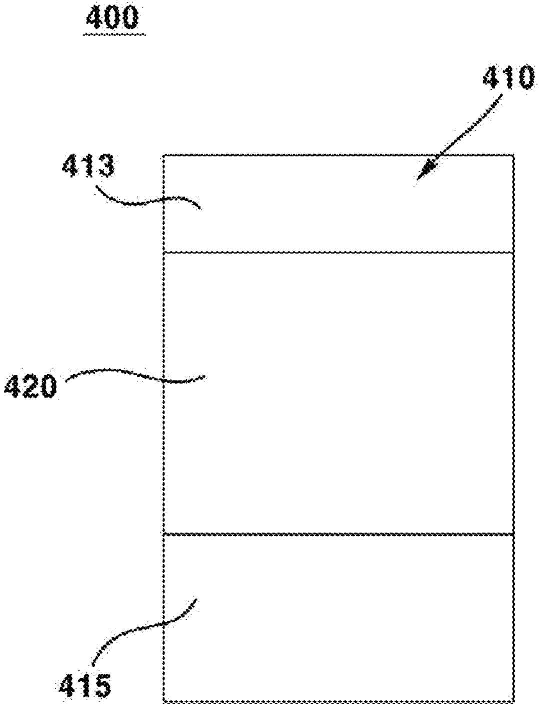
FIG. 5 is a plan view illustrating an upper surface of a heat transfer member according to an embodiment of the present invention.
Figure 6:
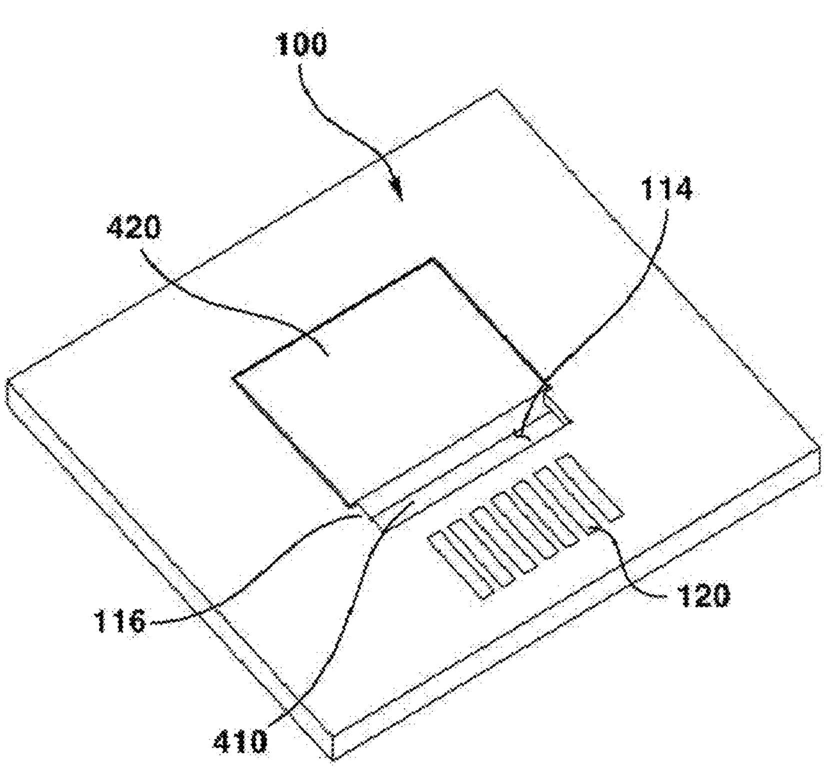
FIG. 6 is a perspective view illustrating an upper surface of a printed circuit board module according to an embodiment of the present invention.
Figure 7:
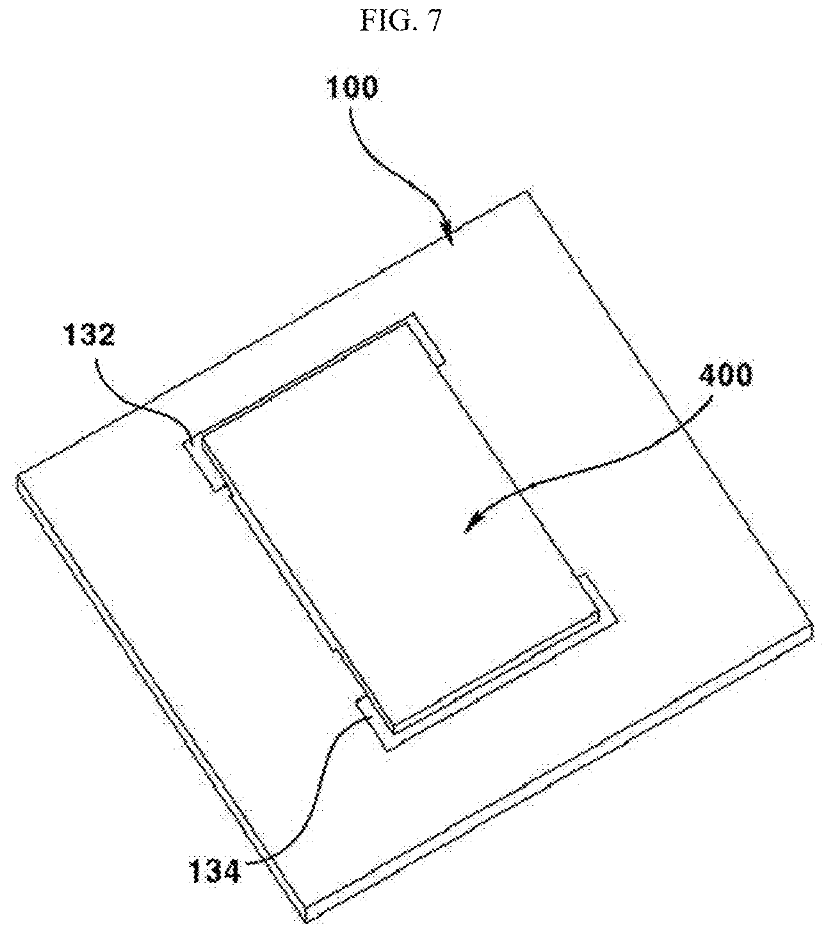
FIG. 7 is a perspective view illustrating a lower surface of a printed circuit board module according to an embodiment of the present invention.

FIG. 1 is an exploded perspective view of a printed circuit board module according to an embodiment of the present invention; FIG. 2 is a plan view illustrating one surface of a printed circuit board according to an embodiment of the present invention; FIG. 3 is a plan view illustrating the other surface of a printed circuit board according to an embodiment of the present invention; FIG. 4 is a plan view illustrating a side surface of a heat transfer member according to an embodiment of the present invention; FIG. 5 is a plan view illustrating an upper surface of a heat transfer member according to an embodiment of the present invention; FIG. 6 is a perspective view illustrating an upper surface of a printed circuit board module according to an embodiment of the present invention; and FIG. 7 is a perspective view illustrating a lower surface of a printed circuit board module according to an embodiment of the present invention.

Referring to FIGS. 1 to 7, a printed circuit board module according to an embodiment of the present invention may be disposed inside an electronic device. The electronic device may include a housing that forms an external shape, and a space may be formed inside the housing to dispose the printed circuit board module.

The printed circuit board module may include a substrate 100, an electronic component 200, a heat emitting body 300, and a heat transfer member 400.

The substrate 100 may be a printed circuit board (PCB). The substrate 100 may be formed in a plate shape. At least one device for driving the electronic device may be disposed on one surface or on the other surface of the substrate 100.

The substrate 100 may include a hole 110. The hole 110 may be formed to penetrate from one surface of the substrate 100 to the other surface. The protruded portion 420 of the heat transfer member 400 may be coupled to the hole 110.

The hole 110 may include a first region 112 and a second region 114. The first region 112 and the second region 114 may be communicated with each other. At least a portion of the heat transfer member 400 may be inserted into the first region 112. The portion may be a protruded portion 420, which will be described later.

The first region 112 and the second region 114 may have different cross-sectional areas. For example, the cross-sectional area of the first region 112 may be larger than that of the second region 114. The width of the first region 112 may be larger than the width of the second region 114. The cross-sectional shape of the first region 112 may correspond to or be larger than the cross-sectional shape of the protruded portion 420 of the heat transfer member 400.

The first region 112 and the second region 114 may be disposed adjacent to each other in a first direction X.

With respect to the first direction X, the length of the first region 112 may be greater than the length of the second region 114. In addition, the length of the first region 112 may be greater than the length of the second region 114 with respect to a second direction Y perpendicular to the first direction X. To this end, a step 116 being protruded more inward than other regions may be formed in a region where the second region 114 is formed among the inner surfaces of the hole 110. The steps 116 may be provided in plural and disposed to face each other with respect to the second region 114.

Both surfaces of the substrate 100 may be divided into one surface and the other surface. Hereinafter, it will be explained on the base that the coupling surface of the electronic component 200 among the surfaces of the substrate 100 is defined as one surface of the substrate 100, and the coupling surface of the heat transfer member 400 and the heat emitting body 300 is defined as the other surface of the substrate 100.

A circuit pattern 120 being electrically connected to the electronic component 200 may be formed on one surface of the substrate 100. The circuit pattern 120 may be disposed in a region spaced apart from the hole 110 in a first direction X. The circuit pattern 120 may be disposed to be spaced apart from the second region 114 by a predetermined distance in a first direction X, and the second region 114 may be disposed between the first region 112 and the circuit pattern 120.

The circuit pattern 120 is a region where the metal layer is exposed, and the lead 220 of the electronic component 200, which will be described later, can be coupled thereto. The circuit patterns 120 may be provided in plural numbers and disposed to be spaced apart from each other along the second direction Y.

According to the present embodiment, there is an advantage in that the circuit pattern 120 being electrically connected to the electronic component 200 is separated from the hole 110 by a predetermined distance so that it is possible to inhibit the generation of electrical noise between the heat emitting body 300 and the heat transfer member 400 that are in physical contact with the electronic component 200. For example, with respect to the first direction X, the circuit pattern 120 and the first region 112 may be spaced apart from each other by 2.5 mm to 3.5 mm.

When the length of the second region 114 in a first direction X is L1 and the distance between the second region 114 and the circuit pattern 120 in a first direction X is L2, L1:L2=2:1 can be satisfied.

A pad 130 may be disposed on the other surface of the substrate 100. The pad 130 may be a region where a metal layer in the substrate 100 is exposed. Inside the pad 130, ground of a power source can be formed. Accordingly, the pad 130 may also be called a ground region. A body portion 410 of the heat transfer member 400 may be coupled to the pad 130. The body portion 410 may be soldered to the pad 130.

The pad 130 may be provided in plural and disposed to be spaced apart from each other. A plurality of pads 130 may be disposed to face each other with respect to the hole 110. For example, the first pad 132 of the plurality of pads 130 is disposed to be spaced apart from the first region 112 in a first direction X, and a second pad 134 may be disposed to be spaced apart from the second region 114 in a first direction X.

The length of the pad 130 in a second direction Y may be formed to be longer than the length of the first region 112 or the second region 114.

The electronic component 200 may be coupled to one surface of the substrate 100. The electronic component 200 is for driving the electronic device and may include a FET element, an inductor for obtaining inductance, a transformer for voltage conversion, and the like.

The electronic component 200 may include a core 210, a lead 220 being extended from the core 210 and coupled to the circuit pattern 120, and a metal layer 230 being disposed on a surface of the core 210.

The core 210 may form the external shape of the electronic component 200. The lead 220 is extended outward from one side surface of the core 210, and an end thereof may be coupled to the circuit pattern 120. The lead 220 may be soldered to the circuit pattern 120. Accordingly, the electronic component 200 may be electrically connected to the substrate 100.

The metal layer 230 has a predetermined thickness and may be disposed on a lower surface of the core 210. The metal layer 230 may be formed to have a larger cross-sectional area than the core 210. The metal layer 230 may be formed to correspond to the cross-sectional shape of the first region 112 or a protruded portion 420, which will be described later, but is not limited thereto. The metal layer 230 may be soldered to an upper surface of the protruded portion 420.

The heat emitting body 300 may be disposed at a lower portion of the substrate 100. The upper surface of the heat emitting body 300 may be spaced apart from the lower surface of the substrate 100 by a predetermined distance. The heat emitting body 300 may be a housing that forms the external shape of the electronic device. In this case, based on FIG. 1, the upper surface 310 of the heat emitting body 300 may be defined as the inner surface of the housing.

An insulating pad 500 made of an insulating material may be disposed on the upper surface 310 of the heat emitting body 300 facing the other surface of the substrate 100. The insulating pad 500 has a plate shape and can insulate the heat emitting body 300 and the substrate 100, and the heat emitting body 300 and the heat transfer member 400 from each other.

Heat dissipation fins 320 being protruded more downward than other regions may be disposed on a lower surface facing the upper surface 310 of the heat emitting body 300. The heat dissipation fins 320 may be provided in plural and disposed to be spaced apart from one another. The heat dissipation fins 320 can increase the surface area of the heat emitting body 300, thereby efficiently dissipating heat generated from the substrate 100 or the electronic component 200.

The heat transfer member 400 may be disposed between the heat emitting body 300 and the substrate 100. The heat transfer member 400 is made of a metal material and can transfer heat generated from the electronic component 200 and the substrate 100 to the heat emitting body 300. The heat transfer member 400 may be referred to as a metal plate.

The heat transfer member 400 may include a body portion 410 and a protruded portion 420. The width of the body portion 410 defined in the first direction X may be greater than the width of the hole 110, and the width of the protruded portion 420 may be smaller than the width of the hole 110.

The body portion 410 may be disposed between the lower surface of the substrate 100 and the upper surface 310 of the heat emitting body 300. The body portion 410 may have a plate shape. The cross-sectional area of the body portion 410 may be formed to be larger than the cross-sectional area of the hole 110.

The body portion 410 may be partitioned into a first body portion 413 and a second body portion 415 with respect to the protruded portion 420. The first body portion 413 may be disposed to face the first pad 132. The upper surface of the first body portion 413 may be in contact with the lower surface of the first pad 132. The upper surface of the first body portion 413 may be soldered to the first pad 132. The second body portion 415 may be disposed to face the second pad 134. The upper surface of the second body portion 415 may be in contact with the lower surface of the second pad 134. The upper surface of the second body portion 415 may be soldered to the second pad 134.

Meanwhile, the region of the body portion 410 being soldered to the first pad 132 and the second pad 134 may be an edge region adjacent to both ends of the body portion 410 with respect to a first direction X.

With respect to the first direction X, the length of the first body portion 413 and the length of the second body portion 415 may be different. With respect to the first direction X, the first distance from one end of the protruded portion 420 to one end of the body portion 410 may be greater than the second distance from the other end of the protruded portion 420 to the other end of the body portion 410. As an example, the length of the second body portion 415 in the first direction X may be longer than the length of the first body portion 413 in the first direction X. The upper surface of the second body portion 415 may be disposed to face the lower surface of the substrate 100 through the second region 114.

The protrusion 420 may be formed to be protruded upward from the upper surface of the body portion 410. The heat transfer member 400 may be coupled to penetrate the substrate 100 through the protruded portion 420. The protruded length from the upper surface of the body portion 410 to the upper surface of the protruded portion 420 may correspond to the thickness of the substrate 100 in an up and down direction. The thickness of the protruded portion 420 may be formed to be greater than the thickness of the body portion 410.

With respect to the first direction Y, the length of the protruded portion 420 may be formed to be larger than the length of the second region 114.

One side surface of the protruded portion 420 may be spaced apart from one side surface of the hole 110. Specifically, one side surface of the protruded portion 420 coupled to the first region 112 may be spaced apart from one side surface of the second region 114 with respect to the first direction X.

The cross-sectional shape of the protruded portion 420 may be formed to correspond to the cross-sectional shape of the first region 112. The upper surface of the protruded portion 420 may be in contact with the lower surface of the metal layer 230 of the electronic component 200. The lower surface of the metal layer 230 may be soldered to the upper surface of the protruded portion 420. Each of the lower surface of the metal layer 230 and the upper surface of the protruded portion 420 may be tin plated for soldering.

According to the above structure, due to the contact structure of the electronic component 200 and the heat transfer member 400, the driving heat of the electronic component 200 is directly and easily transmitted to the heat transfer member 400 and the heat emitting body 300, so it has the advantage of enhancing the heat dissipation efficiency.

Specifically, in addition to the contact structure with the electronic component 200 through the protruded portion 420, the overall cross-sectional area of the heat transfer member 400 through the body portion 410 is increased, so that the heat dissipation efficiency can be enhanced by increasing the effective cross-sectional area of the heat transfer member 400 being connected to the heat emitting body 300 and the insulating pad 500.

Meanwhile, although not illustrated, a groove may be formed on a surface of the heat emitting body 300 to which the heat transfer member 400 is coupled so that the body portion 410 is coupled thereto. In this case, the groove may be formed to correspond to the cross-sectional shape of the body portion 410. In addition, the insulating pad 500 may be disposed between the lower surface of the groove and the surface of the body portion 410. With this configuration, heat is emitted from the grooves formed in the heat emitting body 300 toward the lower surface and a plurality of side surfaces of the body portion 410, so that the heat can be emitted more effectively.

In the above description, it is described that all the components constituting the embodiments of the present invention are combined or operated in one, but the present invention is not necessarily limited to these embodiments. In other words, within the scope of the present invention, all of the components may be selectively operated in combination with one or more. In addition, the terms "comprise", "include" or "having" described above mean that the corresponding component may be inherent unless specifically stated otherwise, and thus it should be construed that it does not exclude other components, but further include other components instead. All terms, including technical and scientific terms, have the same meaning as commonly understood by one of ordinary skill in the art unless otherwise defined. Terms used generally, such as terms defined in a dictionary, should be interpreted to coincide with the contextual meaning of the related art, and shall not be interpreted in an ideal or excessively formal sense unless explicitly defined in the present invention.

The above description is merely illustrative of the technical idea of the present invention, and those skilled in the art to which the present invention pertains may make various modifications and changes without departing from the essential characteristics of the present invention. Therefore, the embodiments disclosed in the present invention are not intended to limit the technical idea of the present invention but to describe the present invention, and the scope of the technical idea of the present invention is not limited by these embodiments. The protection scope of the present invention should be interpreted by the following claims, and all technical ideas within the equivalent scope should be interpreted as being included in the scope of the present invention.

The invention claimed is:

1. An electronic device comprising:

a substrate including a hole;

an electronic component disposed on one surface of the substrate;

a heat emitting body disposed on an other surface of the substrate; and a heat transfer member disposed between the electronic component and the heat emitting body, wherein the hole includes a first region into which a portion of the heat transfer member is inserted and a second region having a smaller width than does the first region, wherein when an arrangement direction of the first region and the second region is referred to as a first direction, a length of the portion of the heat transfer member is longer than a length of the second region with respect to a second direction perpendicular to the first direction, wherein the substrate includes a circuit pattern electrically connected to the electronic component, and wherein when the length of the second region in the first direction is L1 and the separation distance between the second region and the circuit pattern with respect to the first direction is L2, L1:L2=2:1 is satisfied.

2. The electronic device according to claim 1, wherein a step protruded more inward than other regions is disposed on an inner surface of the hole.

3. The electronic device according to claim 1, including:

an insulating pad disposed between the heat emitting body and the heat transfer member.

4. The electronic device according to claim 1, wherein the heat emitting body includes a plurality of heat dissipation fins protruded from an outer surface of the heat emitting body.

5. The electronic device according to claim 1, wherein a surface of the heat emitting body facing the substrate is an inner surface of a housing that forms an external shape of the electronic device.

6. An electronic device comprising:
a substrate including a hole;
an electronic component disposed on one surface of the substrate;
a heat emitting body disposed on an other surface of the substrate; and
a heat transfer member disposed between the electronic component and the heat emitting body,
wherein the hole includes a first region into which a portion of the heat transfer member is inserted and a second region having a smaller width than does the first region,
wherein the heat transfer member includes:
a body portion having a length greater than a length of the hole with respect to a first direction; and
a protruded portion extended from the body portion to be disposed in the hole of the substrate and connected to the electronic component,
wherein the body portion is soldered to the substrate, and
wherein the electronic component is soldered to a surface of the protruded portion.

7. The electronic device according to claim 6, wherein the heat emitting body and the substrate are spaced apart by the body portion.

8. The electronic device according to claim 6, wherein a first distance from one end of the protruded portion to one end of the body portion is greater than a second distance from an other end of the protruded portion to an other end of the body portion.

9. The electronic device according to claim 8, wherein an area of the body portion having the second distance overlaps the second region of the hole.

10. The electronic device according to claim 6, wherein a thickness of the protruded portion is the same as a thickness of the substrate.

11. An electronic device comprising:
a substrate including a hole;
an electronic component disposed on one surface of the substrate;
a heat emitting body disposed on an other surface of the substrate; and
a heat transfer member disposed between the electronic component and the heat emitting body,
wherein the hole includes a first region into which a portion of the heat transfer member is inserted and a second region having a smaller width than does the first region,
wherein the heat transfer member includes:
a body portion having a length greater than a length of the hole with respect to a first direction; and
a protruded portion extended from the body portion to be disposed in the hole of the substrate and connected to the electronic component, and
wherein a pad to which the body portion is soldered is disposed on a surface of the substrate.

12. An electronic device comprising:
a substrate including a hole;
an electronic component disposed on one side of the substrate;
a heat emitting body disposed on an other surface of the substrate; and
a heat transfer member disposed between the electronic component and the heat emitting body,
wherein the hole includes a first region into which a portion of the heat transfer member is inserted and a second region having a smaller width than does the first region,
wherein the heat transfer member penetrates the substrate,
wherein one side surface of the heat transfer member is spaced apart from one side surface of the hole of the substrate in a first direction,
wherein the heat transfer member includes:
a body portion having a length greater than a length of the hole with respect to a first direction; and
a protruded portion extended from the body portion to be disposed in the hole of the substrate and connected to the electronic component,
wherein a first distance from one end of the protruded portion to one end of the body portion is greater than a second distance from an other end of the protruded portion to an other end of the body portion, and
wherein an area of the body portion having the second distance overlaps the second region of the hole.

13. The electronic device according to claim 12, wherein a circuit pattern to which leads of the electronic component are coupled is formed on an outside of the hole on a surface of substrate.

14. The electronic device according to claim 12, wherein a step protruded more inward than other regions is disposed on an inner surface of the hole.

15. The electronic device according to claim 12, including:
an insulating pad disposed between the heat emitting body and the heat transfer member.

16. The electronic device according to claim 12, wherein the heat emitting body includes a plurality of heat dissipation fins protruded from an outer surface of the heat emitting body.

* * * * *